US012785354B2

(12) United States Patent
Miura

(10) Patent No.: US 12,785,354 B2
(45) Date of Patent: Nov. 3, 2026

(54) LIGHT-EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 609 days.

(21) Appl. No.: 18/364,443

(22) Filed: Aug. 2, 2023

(65) Prior Publication Data

US 2024/0047937 A1 Feb. 8, 2024

(30) Foreign Application Priority Data

Aug. 3, 2022 (JP) ................................ 2022-124163

(51) Int. Cl.
*H01S 5/02315* (2021.01)
*H01S 5/00* (2006.01)
*H01S 5/02253* (2021.01)

(52) U.S. Cl.
CPC ........ *H01S 5/02315* (2021.01); *H01S 5/0014* (2013.01); *H01S 5/02253* (2021.01)

(58) Field of Classification Search
CPC .................................................. H01S 5/02315
See application file for complete search history.

(56) References Cited

U.S. PATENT DOCUMENTS

2004/0028095 A1 2/2004 Ishida et al.
2009/0294789 A1 12/2009 Yoshida
2014/0226689 A1 8/2014 Takeda et al.
2018/0003362 A1 1/2018 Miyata
2019/0035700 A1 1/2019 Murayama et al.
2020/0343685 A1 10/2020 Tajiri
2021/0119409 A1 4/2021 Miyata
2022/0003845 A1* 1/2022 Wang .................... G01S 7/4814
2022/0209078 A1 6/2022 Hashimoto et al.
2023/0045559 A1 2/2023 Hettler et al.
2023/0090933 A1* 3/2023 Miura ................ H10H 20/8506 257/99
2024/0021771 A1* 1/2024 Sato ................... H10H 20/8506
2025/0174962 A1* 5/2025 Kitajima ............. H01S 5/02325
2025/0364788 A1* 11/2025 Carras .................. H01S 5/4031

FOREIGN PATENT DOCUMENTS

DE 102022132657 A1 * 8/2023 ......... H10H 20/8514
EP 4283691 A1 * 11/2023 ............ H10W 90/00
JP 2004-006749 A 1/2004
JP 2009-289775 A 12/2009
(Continued)

*Primary Examiner* — Deandra M Hughes
(74) *Attorney, Agent, or Firm* — Spencer Fane LLP

(57) ABSTRACT

A light-emitting device includes a light-emitting element, a substrate supporting the light-emitting element, and one or more lateral wall portions joined to the substrate to surround the light-emitting element. The one or more lateral wall portions includes a first lateral wall portion having a light incident surface configured to receive a light emitted from the light-emitting element and traveling in a first direction and a light exit surface configured to emit the light. The substrate has a joint surface joined to the first lateral wall portion and a lateral surface meeting the joint surface. The lateral surface is located between the light incident surface and the light exit surface in a top view as viewed in a direction perpendicular to the joint surface.

15 Claims, 11 Drawing Sheets

(56) References Cited

FOREIGN PATENT DOCUMENTS

| | | | |
|---|---|---|---|
| JP | 2011-151080 | A | 8/2011 |
| JP | 2013-065600 | A | 4/2013 |
| JP | 2013-084810 | A | 5/2013 |
| JP | 2018-011045 | A | 1/2018 |
| JP | 2019-117880 | A | 7/2019 |
| JP | 2019-125614 | A | 7/2019 |
| JP | 2021-057459 | A | 4/2021 |
| JP | 2021-068743 | A | 4/2021 |
| JP | 2022-101471 | A | 7/2022 |
| WO | 2017/149573 | A1 | 9/2017 |
| WO | 2021-214040 | A1 | 10/2021 |

* cited by examiner

LIGHT-EMITTING DEVICE

CROSS-REFERENCE TO RELATED APPLICATIONS

This application is based upon and claims the benefit of priority from Japanese Patent Application No. 2022-124163, filed on Aug. 3, 2022, the entire contents of which are incorporated herein by reference.

BACKGROUND

The present disclosure relates to a light-emitting device.

Packages in which light-emitting elements are encapsulated are being developed. Japanese Unexamined Patent Application Publication No. 2009-289775 discloses a light-emitting device including a first substrate, a light-emitting element mounted on the first substrate, and a second substrate forming a sealing space for the light-emitting element. The second substrate has a light guide hole through which light emitted from the light-emitting element passes. A light exiting window covers the light guide hole from outside the second substrate to seal the space.

SUMMARY

There is a case where the optical path length of light from a light-emitting element is intended to be reduced to dispose other components. If a light-emitting device having such a structure as to enable other components to be mounted by reducing the distance from the light-emitting element can be provided, flexibility in mounting the other components is enhanced.

In an illustrative and nonlimiting embodiment, a light-emitting device includes a light-emitting element, a substrate supporting the light-emitting element, and one or more lateral wall portions joined to the substrate to surround the light-emitting element. The one or more lateral wall portions includes a first lateral wall portion having a light incident surface configured to receive a light emitted from the light-emitting element and traveling in a first direction and a light exit surface configured to emit the light. The substrate has a joint surface joined to the first lateral wall portion and a lateral surface meeting the joint surface. The lateral surface is located between the light incident surface and the light exit surface in a top view as viewed in a direction perpendicular to the joint surface.

An embodiment in the present disclosure can provide a light-emitting device in which the distance from a light-emitting element is reduced to enable other components to be mounted.

DETAILED DESCRIPTION

Figure 1:
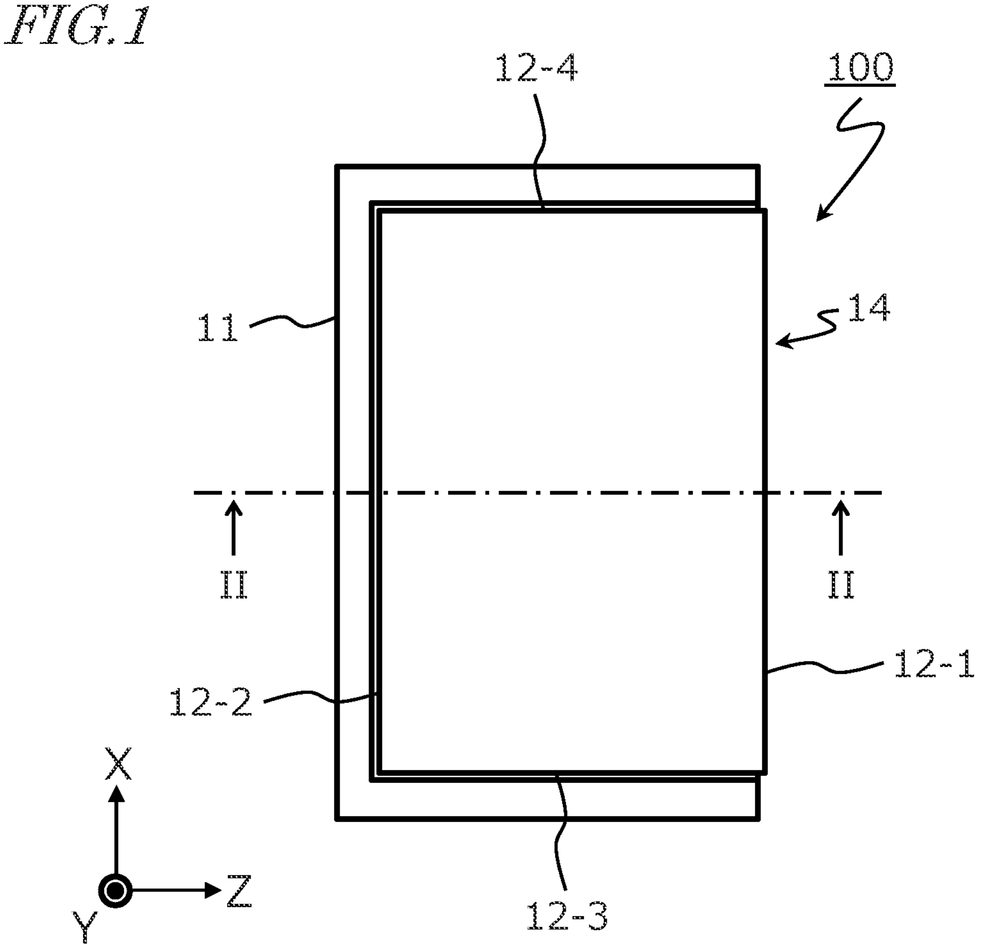
FIG. 1 is a schematic top view of a light-emitting device according to a first embodiment in the present disclosure.

In the present specification or the claims, polygonal shapes such as triangular shapes and quadrangular shapes are not limited to polygonal shapes in the mathematically strict sense and include polygonal shapes with rounded corners, beveled corners, angled corners, reverse-rounded corners. Likewise, not only polygonal shapes with such modification at corners (end of sides) but also polygonal shapes with modifications at intermediate portions of sides of the shapes are also referred to as polygonal shapes. That is, shapes based on polygonal shapes and partially modified are also included in "polygonal shapes" in the present specification and the claims.

The same applies to not only polygonal shapes but also applies to terms denoting specific shapes such as trapezoids, circles, protrusions, and recesses. The same applies to sides forming such shapes. That is, even if an end or an intermediate portion of a side is modified, the modified portion is included in a portion of a "side." When "polygonal shapes" and "sides" without such modified portions are intended to be distinguished from those with modifications, the term "exact" is added, such as an "exact quadrangular shape."

In the present specification or the claims, in the case where a plurality of elements are specified by a name and are distinguished from one another, an ordinal numeral such as "first" and "second" may be added to the beginning of the name of each element. For example, in the case where the claims include the description "light-emitting elements are arranged on a substrate," the specification may include the description "a first light-emitting element and a second light-emitting element are arranged on a substrate." The ordinal numerals "first" and "second" are used to distinguish the two light-emitting elements from each other. The name of an element with the same ordinal numeral may not indicate the same element in the specification and the claims. For example, in the case where elements specified by the terms "first light-emitting element," "second light-emitting element," and "third light-emitting element" are disclosed in the specification, the "first light-emitting element" and the "second light-emitting element" in the claims may correspond to the "first light-emitting element" and the "third light-emitting element" in the specification. In the case where the term "first light-emitting element" is used and the term "second light-emitting element" is not used in claim 1 described in the claims, it is sufficient that the invention according to claim 1 includes one light-emitting element, and the light-emitting element is not limited to the "first light-emitting element" but can be the "second light-emitting element" or the "third light-emitting element" in the specification.

In the present specification or the claims, terms representing particular directions or positions (such as "up/upper," "down/lower," "right," "left," "front," and "back") may be used. These terms are used merely for the sake of ease of, representing relative directions or relative positions in the reference drawings. As far as the relative directions or positions mentioned by the terms "up/upper," "down/lower," and the like designate the same directions or positions in the reference drawings, drawings other than shown in the present disclosure, actual products, and manufacturing equipment do not have to be the same arrangement as shown in the reference drawings.

The dimensions, dimension ratios, shapes, arrangement intervals, and the like of elements or members shown in the drawings may be exaggerated for ease of understanding. The illustration of the elements may be partly omitted to prevent the drawings from being too complicated.

Certain embodiments of the present invention are described below with reference to the accompanying drawings. The embodiments are concrete forms of the technical idea of the present invention but do not limit the present invention. For example, the numerical values, shapes, materials, and the like in the description of the embodiments are only examples and can be modified in various ways as long as technical contradictions do not arise. In the description below, elements specified by the same name or reference numeral are the same element or elements of the same kind, and repetitive descriptions of these elements may be omitted.

A light-emitting device according to an embodiment in the present disclosure can include one or a plurality of light-emitting elements, a substrate supporting the one or plurality of light-emitting elements, one or more lateral wall portions that are joined to the substrate and surround the one or plurality of light-emitting elements, a top portion connected to the one or more lateral wall portions, one or a plurality of submounts, an optical member, a light-receiving element, a lens member, a beam combiner, a protective element typified by a Zener diode, and a temperature measurement element such as a thermistor for measuring the internal temperature.

Light emitted laterally from the one or plurality of light-emitting elements disposed on the substrate in the light-emitting device according to the embodiment in the present disclosure is incident on a light incident surface of a first lateral wall portion and emitted to the outside from a light exit surface of the first lateral wall portion. The first lateral wall portion is included in the one or more lateral wall portions.

First Embodiment

Figure 2:
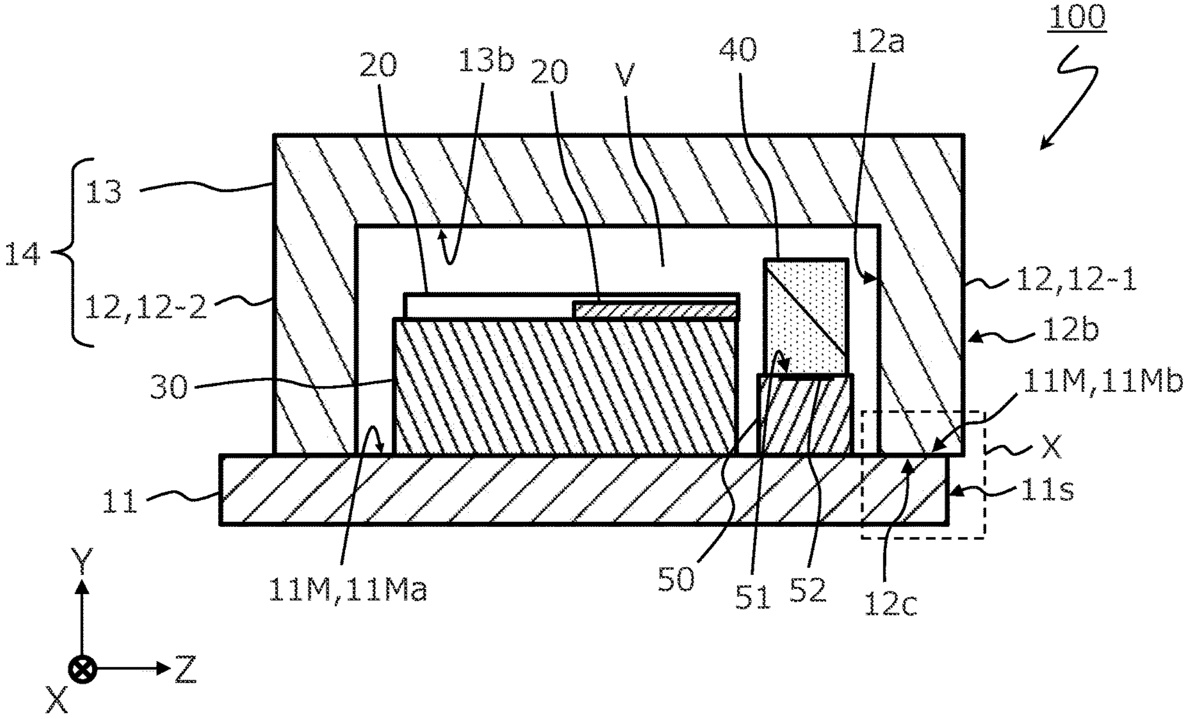
FIG. 2 is a schematic cross-sectional view of the light-emitting device taken along the cutting-plane line II-II of FIG. 1.
Figure 3:
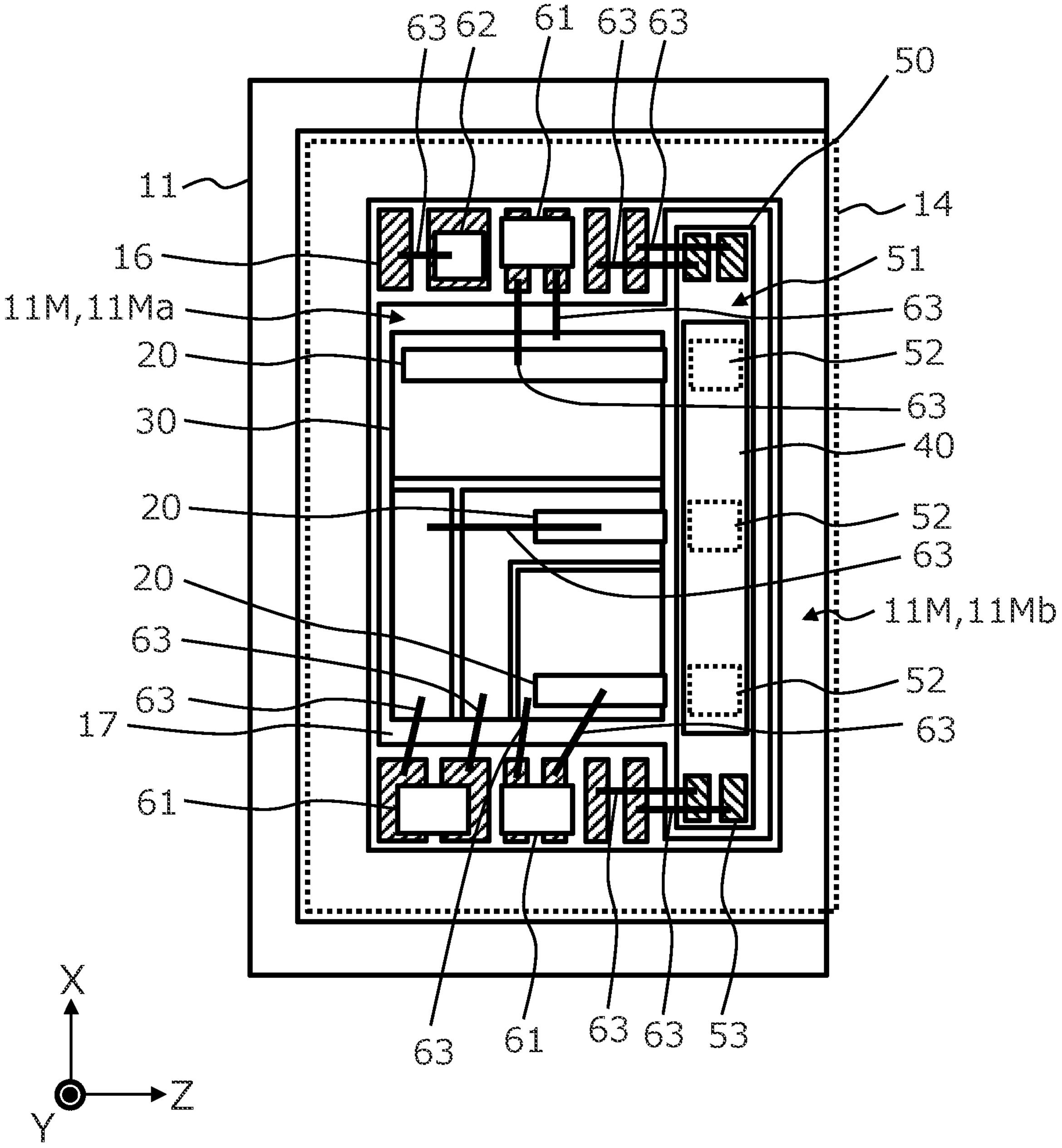
FIG. 3 is a schematic top view of the light-emitting device according to the first embodiment in the present disclosure without a first cap.
Figure 4:
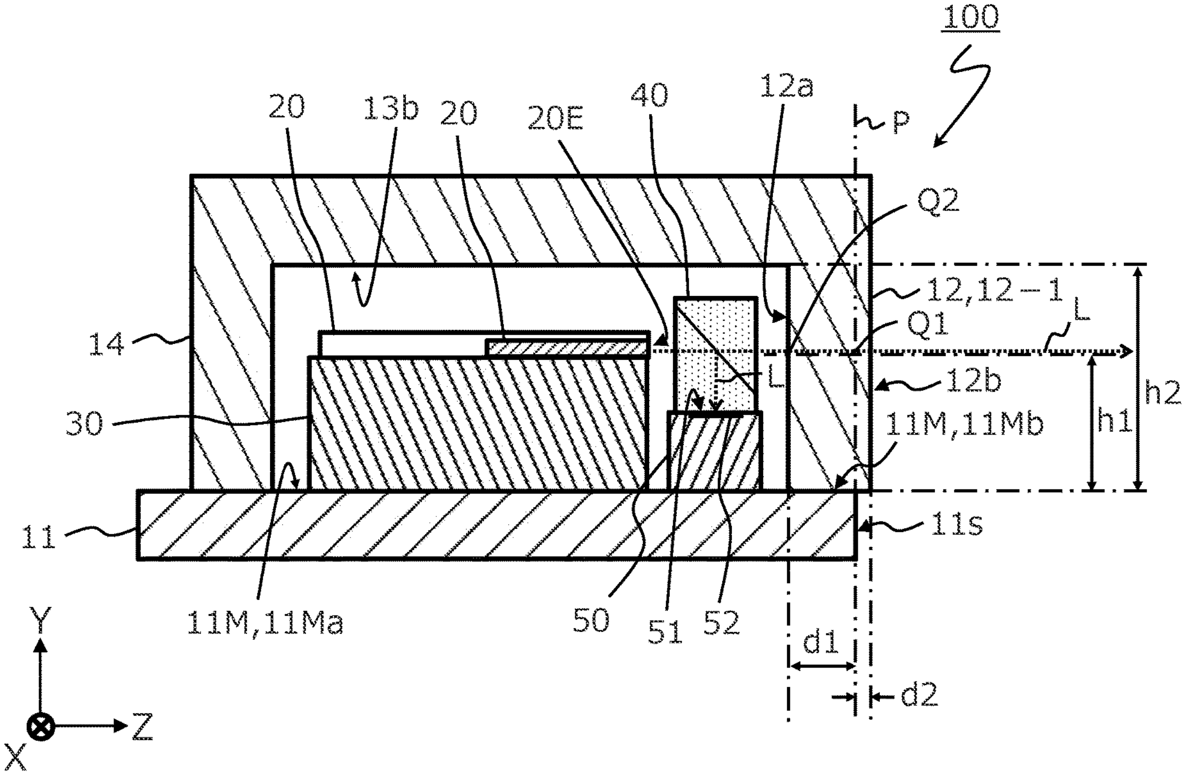
FIG. 4 is a schematic cross-sectional view corresponding to the schematic cross-sectional view of FIG. 2 used for illustrating the position of a lateral surface of a substrate in more detail.
Figure 5:
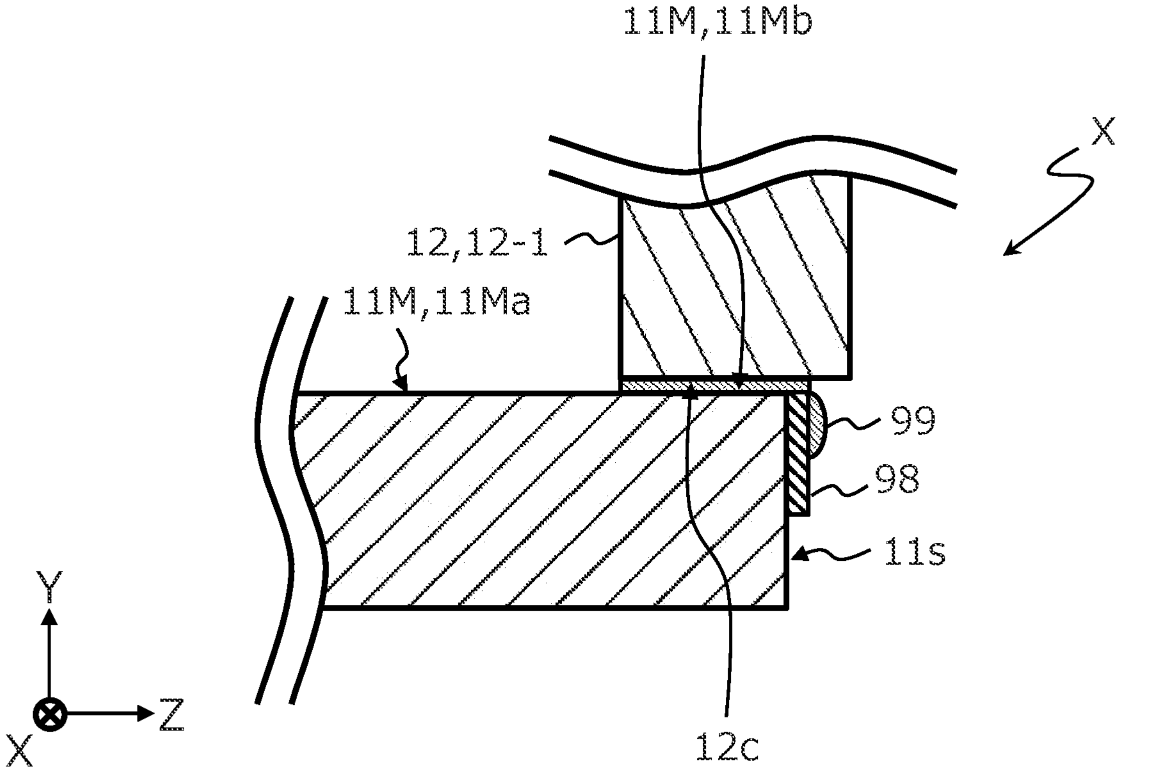
FIG. 5 is a schematic enlarged cross-sectional view of the portion X in the schematic cross-sectional view of FIG. 2.

A light-emitting device 100 according to a first embodiment in the present disclosure will be described referring to FIG. 1 to FIG. 5. FIG. 1 is a schematic top view of the light-emitting device 100. FIG. 2 is a schematic cross-sectional view of the light-emitting device 100 taken along the cutting-plane line II-II of FIG. 1. In FIG. 2, protective elements 61, a temperature measurement element 62, and wiring 63 shown in FIG. 3 are omitted for convenience of illustration. FIG. 3 is a schematic top view of the light-emitting device 100 without a first cap 14. In FIG. 3, the outer periphery of the first cap 14 is indicated by a dotted line for ease of illustration. FIG. 4 is a schematic cross-sectional view corresponding to the schematic cross-sectional view of FIG. 2 used for illustrating the position of a lateral surface of a substrate 11 in more detail. As with FIG. 2, the protective elements 61, the temperature measurement element 62, and the wiring 63 shown in FIG. 3 are omitted in FIG. 4. In FIG. 4, an optical axis L of light emitted from a light-emitting element 20 is indicated by a dotted arrow. FIG. 5 is a schematic enlarged cross-sectional view of the portion X in the schematic cross-sectional view of FIG. 2.

In FIG. 1 to FIG. 5, the X-axis, the Y-axis, and the Z-axis orthogonal to one another are shown for reference. Also in the drawings other than FIG. 1 to FIG. 5, the X-axis, the Y-axis, and the Z-axis orthogonal to one another are shown for reference. The directions of the X-axis, the Y-axis, and the Z-axis are respectively referred to as an X direction, a Y direction, and a Z direction hereinafter. The X direction, the Y direction, and the Z direction are common to the drawings.

The light-emitting device 100 includes the substrate 11, one or a plurality of light-emitting elements 20, and one or more lateral wall portions 12. In the example shown in the drawings, the light-emitting device 100 further includes a top portion 13, a submount 30, an optical member 40, a light-receiving element 50, the protective elements 61, the temperature measurement element 62, and the wiring 63. In the example shown in the drawings, the light-emitting device 100 includes the first cap 14 including the one or more lateral wall portions 12 and the top portion 13.

Each component will be first described.

Substrate 11

For example, the substrate 11 has the shape of a flat plate. The substrate 11 can have an upper surface 11M, a lower surface opposite to the upper surface 11M, and a plurality of lateral surfaces. The substrate 11 in the example shown in the drawings has the upper surface 11M, the lower surface, and four lateral surfaces respectively contiguous to the four sides of the outer periphery of the upper surface 11M. The upper surface 11M can be a flat surface. The upper surface 11M includes an arrangement surface 11Ma on which one or more components are arranged. The substrate 11 can be formed using a ceramic as a main material. Examples of the ceramic include aluminum nitride, silicon nitride, aluminum oxide, and silicon carbide. In the example shown in the drawings, the substrate 11 can have a size of, for example, 0.5 mm or more and 20 mm or less in the X direction and a size of, for example, 0.5 mm or more and 20 mm or less in the Z direction. For example, the size (thickness) in the Y direction can be 0.1 mm or more and 5 mm or less.

The upper surface 11M further includes a joint surface 11Mb. The joint surface 11Mb in the example shown in the drawings is located in the same plane as the arrangement surface 11Ma and around the arrangement surface 11Ma in the upper surface 11M. The arrangement surface 11Ma and the joint surface 11Mb may be located in different planes. The one or more lateral wall portions 12 described below are joined to the joint surface 11Mb. A metal film for joining can be formed on the joint surface 11Mb. Examples of the material for forming the metal film include nickel, gold, titanium, platinum, copper, aluminum, iron, copper-molybdenum, copper-tungsten, and tungsten. The surface of the metal film formed of these materials may be further plated with Ni/Au (metal film layered in the order of Ni and Au), Ti/Pt/Au (metal film layered in the order of Ti, Pt, and Au), or the like. A lateral surface of the substrate 11 intersecting the joint surface 11Mb is referred to as a lateral surface 11*s*. In the example shown in the drawings, the lateral surface 11*s* is parallel to the XY-plane.

One or a plurality of metal layers can be disposed on the upper surface 11M of the substrate 11. Specifically, the one or plurality of metal layers are disposed on the arrangement surface 11Ma of the upper surface 11M. For example, the one or plurality of metal layers are formed of an electric conductor such as a metal, patterned, and disposed on the upper surface 11M. For example, the one or plurality of metal layers are electrically connected to an electronic component disposed on the arrangement surface 11Ma of the substrate 11 via metal wires. In the example shown in the drawings, one or a plurality of metal layers are disposed in each of wiring regions 16 and a metal region 17 of the arrangement surface 11Ma. The wiring regions 16 are provided along two sides of the outer periphery of the arrangement surface 11Ma extending in the Z direction. In other words, the wiring regions 16 are provided along two sides of the inner periphery of the joint surface 11Mb extending in the Z direction. The wiring regions 16 are not provided over the entirety of two sides extending in the Z direction. In the example shown in the drawings, the two wiring regions 16 are spaced apart from each other in the X direction in a top view. A plurality of metal layers are disposed in each wiring region 16. The wiring region 16 may be provided with only one metal layer.

The metal region 17 is provided in the entirety of arrangement surface 11Ma except for the wiring regions 16. In the example shown in the drawings, the metal region 17 has a T shape. One metal layer is disposed in the metal region 17. The metal layer on the arrangement surface 11Ma is electrically connected to one or a plurality of metal layers disposed on the lower surface of the substrate 11 through, for example, via holes. The same material as for the metal film disposed on the joint surface 11Mb can be used as the material of the metal layer disposed on the arrangement surface 11Ma. A material different from the material of the metal film disposed on the joint surface 11Mb may be used to form the metal layer.

Lateral Wall Portion 12

The light-emitting device 100 includes the one or more lateral wall portions 12 extending upward from the upper surface 11M of the substrate 11. The one or more lateral wall portions 12 are joined to the joint surface 11Mb of the substrate 11. More specifically, the one or more lateral wall portions 12 are joined to the substrate 11 with the metal film disposed on the joint surface 11Mb interposed therebetween. The one or more lateral wall portions 12 are not joined to the arrangement surface 11Ma of the substrate 11. In other words, in the upper surface 11M, the region to which the one or more lateral wall portions 12 are joined is referred to as the joint surface 11Mb, and the region located inside the joint surface 11Mb is referred to as the arrangement surface 11Ma. The one or more lateral wall portions 12 surround the arrangement surface 11Ma of the substrate 11 and extend above the upper surface 11M of the substrate 11. For example, the one or more lateral wall portions 12 surround one or more components disposed on the arrangement surface 11Ma.

The one or more lateral wall portions 12 have one or a plurality of inner lateral surfaces and one or a plurality of outer lateral surfaces. The one or more lateral wall portions 12 include a first lateral wall portion 12-1. The first lateral wall portion 12-1 has an inner lateral surface at least partially including a light incident surface 12*a* on which light is incident and an outer lateral surface at least partially including a light exit surface 12*b* from which light is emitted. As for the first lateral wall portion 12-1 in the example shown in the drawings, the entirety of inner lateral surface serves as the light incident surface 12*a*, and the entirety of outer lateral surface serves as the light exit surface 12*b*. An anti-reflection film can be disposed on the light incident surface 12*a* and/or the light exit surface 12*b*.

The term "light-transmissive" as used herein indicates satisfaction of a property that the transmittance of light having a certain wavelength incident on the region is 80% or more. The first lateral wall portion 12-1 has a light-transmissive region between the light incident surface 12*a* and the light exit surface 12*b*. The light-transmissive region of the first lateral wall portion 12-1 is formed of a light-transmissive material such as glass, plastics, sapphire, and quartz. That is, in the example shown in the drawings, there is a light-transmissive material between the light incident surface 12*a* and the light exit surface 12*b*. In the example shown in the drawings, the entirety of first lateral wall portion 12-1 is a light-transmissive region. The light incident surface 12*a* and the light exit surface 12*b* may be parallel to each other and may be parallel to the XY-plane. The term "parallel" as used herein can include a difference of ±5°. The light incident surface 12*a* and the light exit surface 12*b* may each be perpendicular to the upper surface 11M of the substrate 11. The term "perpendicular" as used herein can include a difference of ±5°. The light incident surface 12*a* and the light exit surface 12*b* may be inclined with respect to the upper surface 11M.

The one or more lateral wall portions 12 includes the first lateral wall portion 12-1 and a second lateral wall portion 12-2 located on the side opposite to the first lateral wall portion 12-1 across the upper surface 11M of the substrate 11. The second lateral wall portion 12-2 has an inner lateral surface and an outer lateral surface. The inner lateral surface of the second lateral wall portion 12-2 faces the light incident surface 12*a*. The outer lateral surface of the second lateral wall portion 12-2 is located on the side opposite to the inner lateral surface of the second lateral wall portion 12-2. More specifically, the outer lateral surface is located on the side opposite to the light incident surface 12*a* with respect to the inner lateral surface. In the example shown in the drawings, the inner lateral surface and the outer lateral surface of the second lateral wall portion 12-2 is, for example, parallel to the XY-plane. The second lateral wall portion 12-2 is spaced apart from the first lateral wall portion 12-1 in the Z direction.

The one or more lateral wall portions 12 further include a third lateral wall portion 12-3 and a fourth lateral wall portion 12-4 located on the side opposite to the third lateral wall portion 12-3 across the upper surface 11M of the substrate 11. The third lateral wall portion 12-3 and the fourth lateral wall portion 12-4 each have an inner lateral surface and an outer lateral surface. The inner lateral surface of the third lateral wall portion 12-3 and the inner lateral surface of the fourth lateral wall portion 12-4 face each other. The fourth lateral wall portion 12-4 is spaced apart from the third lateral wall portion 12-3 in the X direction. The first lateral wall portion 12-1 is connected to the third lateral wall portion 12-3 and the fourth lateral wall portion 12-4. Similarly, the second lateral wall portion 12-2 is connected to the third lateral wall portion 12-3 and the fourth lateral wall portion 12-4. In the example shown in the drawings, each of the first to fourth lateral wall portions 12-1 to 12-4 is light-transmissive. It is sufficient that at least the first lateral wall portion 12-1 among the four lateral wall portions is light-transmissive.

The one or more lateral wall portions 12 each have a lower surface. The first lateral wall portion 12-1 has a lower surface 12*c* intersecting the inner lateral surface including the light incident surface 12*a*. The lower surface 12*c* further intersects the outer lateral surface including the light exit surface 12*b*. The first lateral wall portion 12-1 is joined to the joint surface 11Mb of the substrate 11 at the lower surface 12*c*. The one or more lateral wall portions 12 other than the first lateral wall portion 12-1 are also joined to the joint surface 11Mb of the substrate 11 at the respective lower surfaces.

As shown in FIG. 2 or FIG. 3, a portion of the first lateral wall portion 12-1 overlaps the substrate 11 on the joint surface 11Mb, and the other portion projects from the joint surface 11Mb to the outside of the substrate 11 in a top view. More specifically, a portion of the first lateral wall portion 12-1 projects from the joint surface 11Mb on the side opposite to the arrangement surface 11Ma. The area of the lower surface 12*c* joined to the joint surface 11Mb in the lower surface 12*c* of the first lateral wall portion 12-1 is larger than the area of the lower surface 12*c* projecting from the joint surface 11Mb.

The first lateral wall portion 12-1 projects from the substrate 11 in the direction perpendicular to the outer lateral surface. In other words, the outer lateral surface of the first lateral wall portion 12-1 is located outside the lateral surface 11*s* in a top view. More specifically, in the direction perpendicular to the light incident surface 12*a* (or the light exit surface 12*b*) of the first lateral wall portion 12-1, the light exit surface 12*b* is located farther from the arrangement surface 11Ma than the lateral surface 11*s* in a top view.

The lower surface 12*c* can be joined to the joint surface 11Mb with a metal adhesive, a metal bump, or a bonding member containing a metal interposed therebetween. For example, Au particles or solder containing a metal such as AuSn is used as the metal adhesive or the metal bump. For example, a metal film for joining is formed on the lower surface 12*c*.

The lateral surface 11*s* is located between the light incident surface 12*a* and the light exit surface 12*b* in a top view. The lateral surface 11*s* is located between the inner lateral surface of the first lateral wall portion 12-1 including the light incident surface 12*a* and the outer lateral surface of the first lateral wall portion 12-1 including the light exit surface 12*b*.

As illustrated in FIG. 4, in the direction perpendicular to the light incident surface 12*a* (or the light exit surface 12*b*), an interval or a distance d1 from the lateral surface 11*s* to the light incident surface 12*a* is larger than a distance d2 from the lateral surface 11*s* to the light exit surface 12*b*. For example, the distance d2 is about several tens of micrometers. For example, the distance d1 is twice or more and five times or less as large as the distance d2. For example, the distance d1 is 100 μm or more and 500 μm or less.

The one or more lateral wall portions 12 can be formed of a light-transmissive material. Examples of the light-transmissive material include glass, plastics, quartz, and sapphire. In the example shown in the drawings, all the lateral wall portions 12 are formed of a light-transmissive material. Only the first lateral wall portion 12-1 may be formed of a light-transmissive material, and the other lateral wall portions 12 may be formed of a non-light-transmissive material such as ceramics and silicon. Only a portion of the first lateral wall portion 12-1 may be formed of a light-transmissive material to constitute the light-transmissive region.

Top Portion 13

The top portion 13 has an upper surface and a lower surface 13*b*. In the example shown in the drawings, the top portion 13 is located above the upper surface 11M of the substrate 11 and connected to the one or more lateral wall portions 12. The top portion 13 has the lower surface 13*b* facing the upper surface 11M of the substrate 11.

The substrate 11, the one or more lateral wall portions 12, and the top portion define a closed space V. In the example shown in the drawings, the closed space V is a sealed space and can be in a hermetically sealed state.

For example, the top portion 13 can be formed of the same material as the one or more lateral wall portions 12. For example, the one or more lateral wall portions 12 may be formed integrally with the top portion 13. In the example shown in the drawings, the light-emitting device 100 includes the first cap 14 provided by integrally forming the one or more lateral wall portions 12 and the top portion 13. The one or more lateral wall portions 12 and the top portion 13 may be separately formed and bonded with an adhesive or the like. In this case, the top portion 13 can be formed of a non-light-transmissive material. Examples of the non-light-transmissive material include silicon and ceramics.

The first cap 14 in the example shown in the drawings is formed of a light-transmissive material such as glass, plastics, quartz, and sapphire and can be produced by a processing technique such as etching. The first cap 14 is joined to the joint surface 11Mb of the substrate 11. For example, the substrate 11, the one or more lateral wall portions 12, and the top portion 13 define the closed space V, and these members may be collectively referred to as a "package." In the example shown in the drawings, the substrate 11 and the first cap 14 joined to the substrate 11 define the "package."

The first cap 14 in the example shown in the drawings mostly has the shape of a box. The outer shape of the first cap 14 is a rectangular shape in a top view. The outer shape of the first cap 14 is not required to be a rectangular shape but may be, for example, a polygonal shape other than quadrangular shapes or a circular shape in a top view. The first cap 14 can have a size of, for example, 0.5 mm or more and 20 mm or less in the X direction and a size of, for example, 0.5 mm or more and 20 mm or less in the Z direction. For example, the size in the Y direction can be 0.2 mm or more and 5 mm or less.

Light-Emitting Element 20

Examples of the light-emitting element 20 include a semiconductor laser element (or laser diode). The light-emitting element 20 can have a rectangular outer shape in a top view. In the case where the light-emitting element 20 is an edge-emitting semiconductor laser element, a lateral surface intersecting one of the two short sides of the rectangular shape is an emission end surface 20E. The upper surface and the lower surface of the light-emitting element 20 have areas larger than the area of the emission end surface 20E. The light-emitting element 20 is not limited to an edge-emitting semiconductor laser element but may be a surface-emitting semiconductor laser element such as a vertical-cavity surface-emitting laser (VCSEL) or a light-emitting diode (LED).

The light-emitting element 20 in the embodiment in the present disclosure can have one or more light-emitting points on the emission end surface 20E. The light-emitting element 20 may be a single emitter having one light-emitting point on the emission end surface 20E or a multi-emitter having two or more light-emitting points on the emission end surface 20E. The example of the light-emitting element 20 shown in the drawings is a single emitter.

A supplementary description in the case where the light-emitting element 20 is an edge-emitting semiconductor laser element is given. Light (laser beam) emitted from the emission end surface of the semiconductor laser element is a divergent beam having divergence. The laser beam forms an elliptic far-field pattern (hereinafter referred to as "FFP") in a plane parallel to the emission end surface. The FFP is the shape and light intensity distribution of emitted light at a position away from the emission end surface.

The beam of light passing through the center of the shape of the FFP of the laser beam is referred to as an optical axis of the laser beam. The beam traveling on the optical axis shows a peak intensity in the light intensity distribution of the FFP. In the embodiment in the present disclosure, a beam having an intensity of $1/e^2$ or more of the peak intensity in the light intensity distribution of the FFP is referred to as a "main portion" of light, and a beam having an intensity of less than $1/e^2$ of the peak intensity is referred to as a "peripheral portion" of light to distinguish the "main portion" of light from the "peripheral portion" of light. The "main portion" of light may be distinguished from the "peripheral portion" of light using a beam diameter, which is called a "full width at half maximum," at which the intensity in the light intensity distribution of the FFP is half the peak intensity.

As for the elliptic FFP of light emitted from the light-emitting element 20, which is a semiconductor laser element, the minor axis direction of the ellipse is referred to as the slow axis direction, and the major axis direction is referred to as the fast axis direction. A plurality of layers constituting the semiconductor laser element and including an active layer can be layered in the fast axis direction.

The angle corresponding to $1/e^2$ of the light intensity distribution based on the light intensity distribution of the FFP is referred to as a divergence angle of light of the semiconductor laser element. The divergence angle of the beam in the fast axis direction is referred to as the divergence angle in the fast axis direction, and the divergence angle of the beam in the slow axis direction is referred to as the divergence angle in the slow axis direction. The divergence angle in the slow axis direction is smaller than the divergence angle of the fast axis direction.

For example, a semiconductor laser element that emits blue light, a semiconductor laser element that emits green light, a semiconductor laser element that emits red light, or the like can be employed as the light-emitting element 20. Alternatively, a semiconductor laser element that emits other light can be employed.

The blue light herein refers to light with a peak emission wavelength within the range of 420 nm to 494 nm. The green light refers to light with a peak emission wavelength within the range of 495 nm to 570 nm. The red light refers to light with a peak emission wavelength within the range of 605 nm to 750 nm.

Examples of the semiconductor laser element that emits blue light or the semiconductor laser element that emits green light include a semiconductor laser element including a nitride semiconductor. For the nitride semiconductor, for example, GaN, InGaN, and AlGaN can be used. Examples of the semiconductor laser element that emits red light include elements including an InAlGaP, GaInP, GaAs, or AlGaAs semiconductor.

Submount 30

The submount 30 in the example shown in the drawings has an upper surface and a lower surface located on the side opposite to the upper surface and has the shape of a rectangular parallelepiped. The shape of the submount 30 is not limited to a rectangular parallelepiped. The upper surface and the lower surface of the submount 30 can respectively function as two joint surfaces. For example, the submount 30 can be formed of silicon nitride, aluminum nitride, or silicon carbide. A metal film for joining can be disposed on each of the upper surface and the lower surface of the submount 30. A plurality of wiring regions electrically connected to other components can further be provided on the upper surface.

Optical Member 40

The optical member 40 has a partial reflection surface. The partial reflection surface reflects a portion of incident light and transmits the remaining portion of light. The partial reflection surface functions as a beam splitter. A beam incident on the partial reflection surface is split into two beams traveling in different directions. The two split beams include light with the same wavelength. The optical member 40 splits the same wavelength component of incident light into two at a predetermined ratio. For example, one of the two beams split by the optical member 40 can be used as a principal beam (hereinafter referred to as a "main beam"), and the other beam can be used as a beam for monitoring (hereinafter referred to as a "monitor beam") for controlling the main beam. The optical member 40 in the embodiment in the present disclosure can have the shape of a rectangular parallelepiped as illustrated in FIG. 2 or FIG. 3.

When the incident light is split into the main beam and the monitor beam, the intensity of the monitor beam is smaller than the intensity of the main beam. For example, the partial reflection surface transmits 80% or more and 99.5% or less of the incident light and reflects 0.5% or more and 20.0% or less of the incident light.

Light-Receiving Element 50

The light-receiving element 50 has a joint surface, a light receiving surface 51, and a plurality of lateral surfaces. The light receiving surface 51 is located on the side opposite to the joint surface. The light-receiving element 50 has an outer shape of a rectangular parallelepiped. An outer shape other than a rectangular parallelepiped may be employed.

The light receiving surface 51 has a rectangular outer shape and has a length of the light receiving surface in the X direction larger than the length of the light receiving surface in the Z direction. The light receiving surface 51 can include a plurality of light receiving regions 52 each receive light. Examples of the light-receiving element 50 include a photoelectric conversion element (photodiode) that outputs an electric signal corresponding to the intensity or the amount of incident light.

The light-receiving element 50 has a plurality of wiring regions 53. The wiring regions 53 shown in FIG. 3 are indicated by the same hatching. The wiring regions 53 can be provided on the light receiving surface 51. The wiring regions 53 can be provided on a surface other than the light receiving surface 51, such as a lateral surface. The wiring regions 53 are electrically connected to the light receiving regions 52. Wiring that electrically connect the wiring regions 53 to the light receiving regions 52 can be provided on the light receiving surface 51.

Protective Element 61

The protective elements 61 are circuit elements for preventing excessive currents from flowing through and breaking specific elements (such as the light-emitting element 20). Typical examples of the protective elements 61 include voltage regulator diodes such as Zener diodes. A Si diode can be employed as the Zener diode.

Temperature Measurement Element 62

The temperature measurement element 62 is an element used as a temperature sensor for measuring the ambient temperature. For example, a thermistor can be used as the temperature measurement element 62.

Wiring 63

The wiring 63 is constituted of a linear electric conductor with both ends serving as joints. In other words, the wiring 63 includes joints joined to other components at both ends of the linear portion. For example, the wiring 63 is metal wires. Examples of the metal include gold, aluminum, silver, and copper.

Light-Emitting Device 100

Subsequently, an example of the constitution of the light-emitting device 100 will be described.

The light-emitting device 100 according to the first embodiment include s the substrate 11, the first cap 14 including the one or more lateral wall portions 12 and the top portion 13, and the one or plurality of light-emitting elements 20. The light-emitting device 100 in the example shown in the drawings include three light-emitting elements 20. The number of the light-emitting elements 20 is not limited to three but can be one, two, or four or more. The one or plurality of light-emitting elements 20 are disposed on the arrangement surface 11Ma of the substrate 11. More specifically, the one or plurality of light-emitting elements 20 are disposed on the metal region 17 of the arrangement surface 11Ma. In the example shown in the drawings, each light-emitting element 20 is an edge-emitting semiconductor laser element. For example, the one or plurality of light-emitting elements 20 emit light in the first direction. The term "first direction" as used herein refers to a direction parallel to the optical axis of light emitted from the one or plurality of light-emitting elements 20. The first direction is a direction perpendicular to the light incident surface 12*a*. In the example shown in the drawings, the first direction coincides with the Z direction. For example, the three light-emitting elements 20 emit different colors of light selected from a red color of light, a green color of light, and a blue color of light. The light-emitting element 20 can emit light other than visible light, such as infrared light.

The light-emitting device 100 can further include the submount 30. The submount 30 is joined to the arrangement surface 11Ma of the substrate 11 at the lower surface of the submount 30. More specifically, the submount 30 is disposed on the metal region 17 of the arrangement surface 11Ma. The submount 30 can be joined to the arrangement surface 11Ma with a metal adhesive containing Au particles, metal bumps containing a metal such as gold tin and solder, or a bonding member formed of a metal such as a solder alloy interposed therebetween.

The one or plurality of light-emitting elements 20 are directly or indirectly supported by the substrate 11. In the light-emitting device 100 in the example shown in the drawings, the one or plurality of light-emitting elements 20 are disposed on the arrangement surface 11Ma of the substrate 11 with the submount 30 interposed therebetween. The one or plurality of light-emitting elements 20 are aligned in the second direction on the upper surface of the submount 30. The second direction herein is a direction perpendicular to the first direction and is a direction parallel to the upper surface 11M of the substrate 11. In the example shown in the drawings, the second direction coincides with the X direction. The light-emitting elements 20 can be joined to the upper surface of the submount 30 with a metal adhesive containing Au particles, metal bumps containing a metal such as gold tin and solder, or a bonding member formed of a metal such as a solder alloy interposed therebetween.

The light-emitting device 100 further includes the one or plurality of protective elements 61 and the temperature measurement element 62. The one or plurality of protective elements 61 can be disposed on the arrangement surface 11Ma of the substrate 11. More specifically, the protective elements 61 are disposed on the wiring regions 16 located on lateral sides of the submount 30. In the example shown in the drawings, the protective elements 61 are disposed respectively on the two wiring regions 16. The metal layers disposed on the two wiring regions 16 shown in FIG. 3 are indicated by the same hatching. The light-emitting device 100 illustrated in FIG. 3 includes three protective elements 61. Each of the three protective elements 61 is disposed across two metal layers. Two wirings connected to one light-emitting element 20 are respectively joined to the two metal layers on which one protective element is disposed.

As with the protective elements 61, the temperature measurement element 62 can be disposed in a lateral region on the arrangement surface 11Ma. The temperature measurement element 62 is disposed on a metal layer disposed on one wiring region 16. The wiring 63 connected to the temperature measurement element 62 is joined to a metal layer adjacent to the metal layer on which the protective element 61 is disposed.

The light-emitting device 100 in the example shown in the drawings further includes the optical member 40 and the light-receiving element 50. The light-receiving element 50 is disposed on the metal region 17 of the arrangement surface 11Ma of the substrate 11. The length of the portion of the metal region 17 on which the light-receiving element 50 is disposed in the second direction is larger than the length of the portion of the metal region 17 on which the submount 30 is disposed in the second direction. The optical member 40 is disposed on the light receiving surface 51 of the light-receiving element 50. The optical member 40 and the light-receiving element 50 are disposed between the one or plurality of light-emitting elements 20 and the first cap 14 to cross light emitted from the light-emitting elements 20. In other words, the optical member 40 and the light-receiving element 50 are disposed between the one or plurality of light-emitting elements 20 and the first lateral wall portion 12-1.

The light-receiving element 50 is joined to the arrangement surface 11Ma at the joint surface. The light-receiving element 50 can be joined to the arrangement surface 11Ma with a metal adhesive containing Au particles, metal bumps containing a metal such as gold tin and solder, or a bonding member formed of a metal such as a solder alloy interposed therebetween. A plurality of wiring regions 53 of the light-receiving element 50 are connected to the metal layers disposed on the wiring regions 16 via the wiring 63.

Three light receiving regions 52 corresponding to the three light-emitting elements 20 are provided on the light receiving surface 51 as shown in FIG. 3. As with the three light-emitting elements 20, the three light receiving regions 52 are aligned along the X direction on the light receiving surface 51. This constitution allows the main beam to be controlled using the monitor beam for every light-emitting element 20.

Light emitted from the light-emitting elements 20 enters the optical member 40 as shown in FIG. 4. A portion of the light entering the optical member 40 is reflected by the partial reflection surface and directed toward the light receiving regions 52 of the light receiving surface 51 of the light-receiving element 50. The light incident on the light receiving region 52 is used as the monitor beam. A portion of light entering the optical member 40 is transmitted through the partial reflection surface and emitted toward the first lateral wall portion 12-1 of the first cap 14.

The one or plurality of light-emitting elements 20, the submount 30, the optical member 40, and the light-receiving element 50 are disposed on the arrangement surface 11Ma of the substrate 11. The first cap 14 is mounted on the upper surface 11M of the substrate 11 to surround these members. The first cap 14 is joined to the joint surface 11Mb provided around the arrangement surface 11Ma of the substrate 11. The one or more lateral wall portions 12 thus surround the one or plurality of light-emitting elements 20 disposed on the arrangement surface 11Ma. The one or plurality of light-emitting elements 20 are disposed in the sealed space formed by the substrate 11, the one or more lateral wall portions 12, and the top portion 13. The optical member 40 and the light-receiving element 50 are also disposed in the sealed space. The first cap 14 hermetically encapsulates one or a plurality of members including the light-emitting elements 20 disposed on the arrangement surface 11Ma. By hermetically sealing the space in which the light-emitting elements 20 are disposed, deterioration in quality due to dust collection can be reduced.

The one or more lateral wall portions 12 include the first lateral wall portion 12-1 having the light incident surface 12*a* that receives light that is emitted from each light-emitting element 20 and travels in the first direction and the light exit surface 12*b* from which the light is emitted. Light emitted from the optical member 40 is incident on the light incident surface 12*a* of the first lateral wall portion 12-1, transmitted through the inside of the first lateral wall portion 12-1, and emitted to the outside of the first cap 14 from the light exit surface 12*b*.

A virtual plane P, a point Q1, and a point Q2 are defined referring to FIG. 4. In FIG. 4, an optical axis L of light emitted from a light-emitting element 20 is indicated by a dotted arrow, and the virtual plane P is indicated by a dash-dot-dot line. A plane that includes the lateral surface 11*s* of the substrate 11 and is parallel to the lateral surface 11*s* is referred to as the "virtual plane P." An intersection point between the optical axis L of light and the virtual plane P is referred to as the point Q1, and an intersection point between the optical axis L of light and the light incident surface 12*a* is referred to as the point Q2. In the light-emitting device 100 illustrated in FIG. 4, the light incident surface 12*a* and the light exit surface 12*b* of the first lateral wall portion 12-1 and the lateral surface 11*s* of the substrate 11 are parallel to one another. In other words, the light incident surface 12*a*, the light exit surface 12*b*, and the virtual plane P are parallel to one another. The term "parallel" as used herein can include a difference of ±5°.

The optical axis L of light emitted from the light-emitting elements 20 intersects the virtual plane P. The point Q1 is located between the light incident surface 12*a* and the light exit surface 12*b* of the first lateral wall portion 12-1 in a top view. In the light-emitting device 100 illustrated in FIG. 4, a height h1 of the point Q2 from the joint surface 11Mb is larger than half of a height h2 of the lower surface 13*b* of the top portion 13 included in the first cap 14 from the joint surface 11Mb in the direction perpendicular to the joint surface 11Mb. The light receiving surface 51 of the light-receiving element 50 is located below the point Q2 in the direction perpendicular to the joint surface 11Mb. Light that is emitted from the light-emitting elements 20 and reflected downward by the partial reflection surface of the optical member 40 can thus be directed toward the light receiving surface 51.

The joining of the substrate 11 to the first cap 14 will be described referring to FIG. 5. A metal film 98 is disposed on the lateral surface 11*s* of the substrate 11. As described above, the lower surface 12*c* of the lateral wall portion 12 is joined to the joint surface 11Mb of the substrate 11 with, for example, solder 99 interposed therebetween. In this case, a portion of the solder 99 may not remain between the lower surface 12*c* and the joint surface 11Mb but may protrude out of the package (positive direction side in the Z direction in the example shown in the drawings) to form, for example, a spherical solder ball. The solder 99 does not spread over a surface of a ceramic, which can be the material of the substrate 11, so that a solder ball may be formed on the lateral surface 11*s* or the lower surface 12*c*. The formed solder ball may fall off or the like to cause a defect of the light-emitting device. On the other hand, the metal film 98 is disposed on the lateral surface 11*s*, so that the solder flowing out of the outer periphery of the substrate 11 spreads over the metal film 98. Formation of the spherical solder ball can thus be suppressed. Even in the case where the solder ball is formed, the contact area between the solder ball and the substrate 11 increases, and the solder ball is inhibited from falling off. By disposing the metal film 98 on the lateral surface 11*s* as described above, occurrence of problems with the manufacture of the light-emitting device can be reduced.

Second Embodiment

Figure 6:
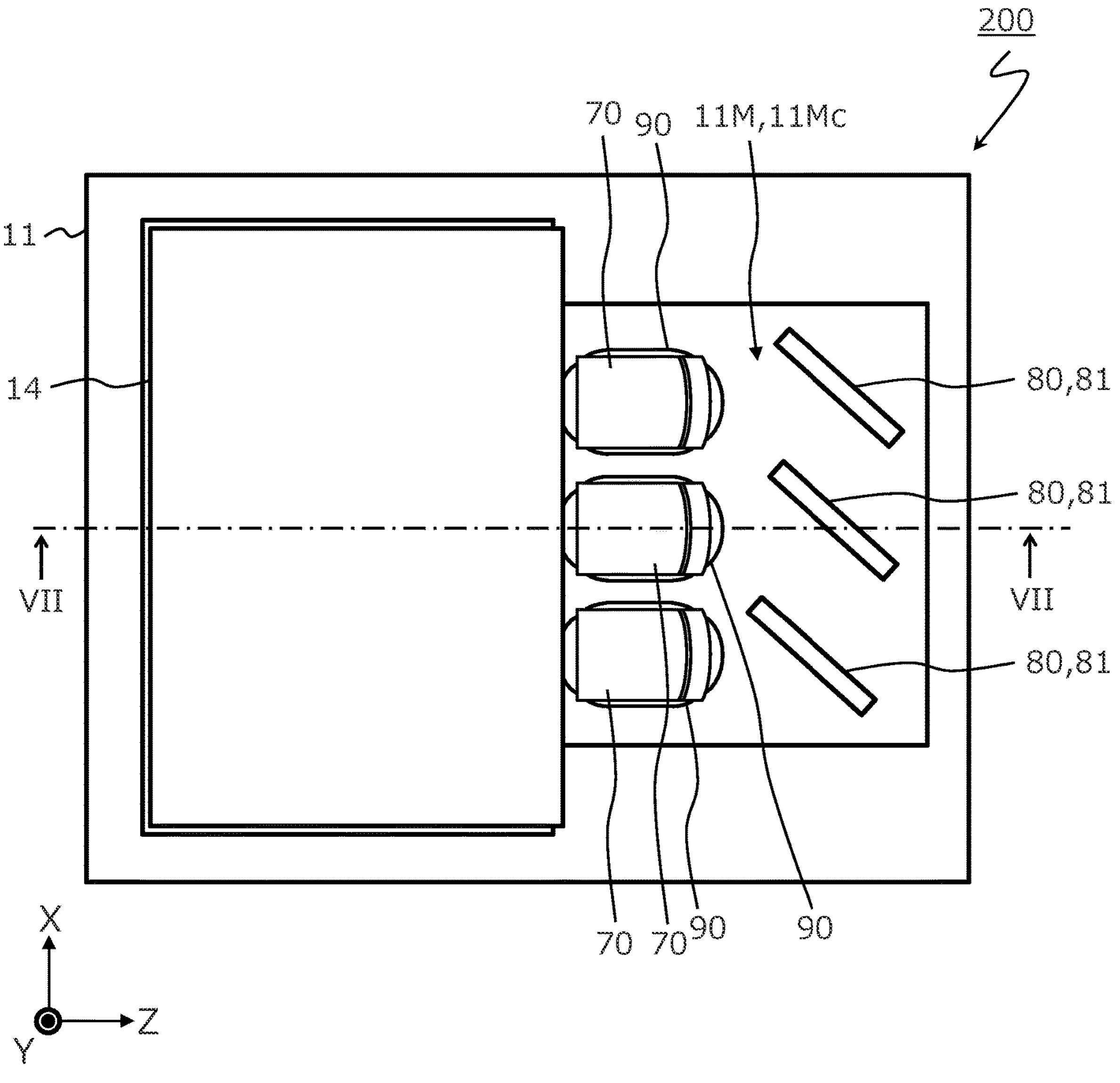
FIG. 6 is a schematic top view of a light-emitting device according to a second embodiment in the present disclosure.
Figure 7:
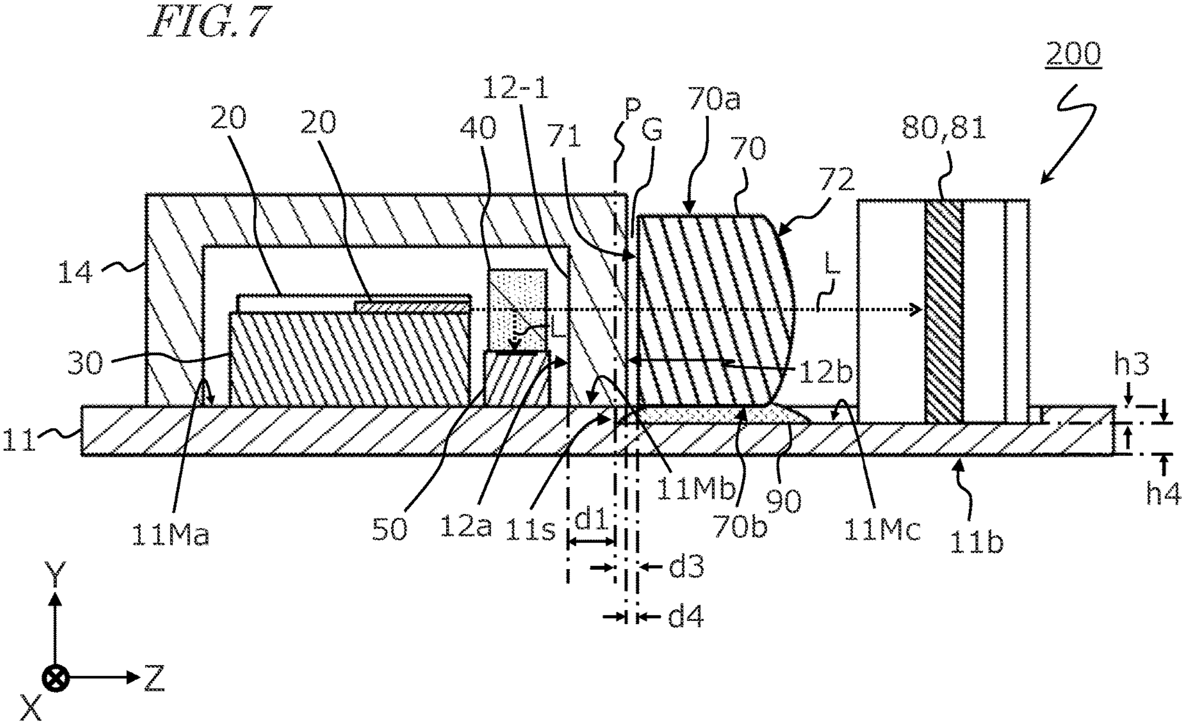
FIG. 7 is a schematic cross-sectional view of the light-emitting device taken along the cutting-plane line VII-VII of FIG. 6.
Figure 8:
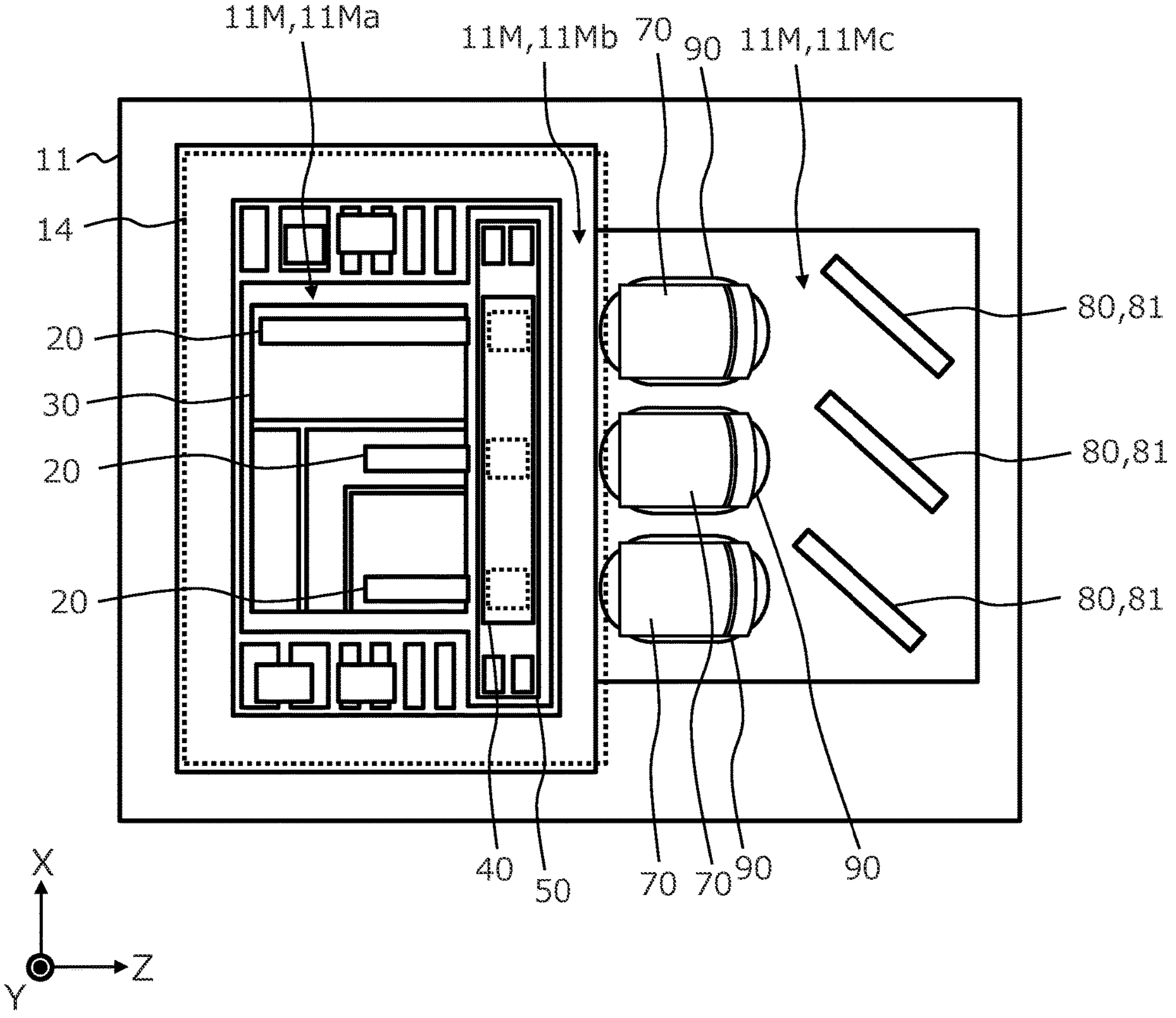
FIG. 8 is a schematic top view of the light-emitting device according to the second embodiment in the present disclosure without the first cap.

Subsequently, a light-emitting device according to a second embodiment will be described referring to FIG. 6 to FIG. 8.

A light-emitting device 200 according to the second embodiment differs from the light-emitting device 100 according to the first embodiment in that one or a plurality of lens members are included and further differs from the light-emitting device 100 according to the first embodiment in that the substrate 11 has a mounting surface 11Mc. FIG. 6 is a schematic top view of the light-emitting device 200 according to the second embodiment. FIG. 7 is a schematic cross-sectional view of the light-emitting device 200 taken along the cutting-plane line VII-VII of FIG. 6. In FIG. 7, the optical axis L of light emitted from a light-emitting element 20 is indicated by a dotted arrow, and the virtual plane P described above is indicated by a dash-dot-dot line. FIG. 8 is a schematic plan view of the light-emitting device 200 without the first cap 14. In FIG. 8, the outer periphery of the first cap 14 is indicated by a dotted line for ease of understanding.

In the light-emitting device 200 according to the second embodiment, the substrate 11 has the mounting surface 11Mc, and the one or plurality of lens members are disposed on the mounting surface 11Mc. In the example shown in the drawings, the light-emitting device 200 further includes a beam combiner 80 on the mounting surface 11Mc. Hereinafter, constitutions according to the differences from the first embodiment are mainly described, and descriptions of common constitutions are omitted as appropriate.

Lens Member 70

A lens member 70 has an upper surface 70*a*, a lower surface 70*b*, a lens incident surface 71 on which light is incident, and a lens exit surface 72 from which light is emitted. The lens exit surface 72 can have a spherical or aspherical lens shape. For example, the lens member 70 collimates light incident on the lens incident surface 71. The lens member 70 may not be a collimating lens but may be a condenser lens. The lens member 70 can be formed of a light-transmissive material, such as glass, plastics, and resins.

Beam Combiner 80

The beam combiner 80 aligns incident beams respectively emitted from a plurality of light-emitting elements with the same axis to emit multiplexed light. The beam combiner 80 can have a structure in which a plurality of optical elements 81 are joined. The optical elements 81 can be formed of a transparent material such as glass and plastics transmitting visible light. For example, the optical elements 81 are implemented using dichroic mirrors. The dichroic mirrors can include dielectric multilayer films having predetermined wavelength selectivity. The dielectric multilayer films can be formed of $Ta_2O_5/SiO_2$, $TiO_2/SiO_2$, $Nb_2O_5/SiO_2$, or the like.

Substrate 11

The upper surface 11M of the substrate 11 included in the light-emitting device 200 has the arrangement surface 11Ma and the joint surface 11Mb and further has the mounting surface 11Mc. Hereinafter, the arrangement surface 11Ma and the joint surface 11Mb may be collectively referred to as a "first surface," and the mounting surface 11Mc may be referred to as a "second surface."

The substrate 11 further has the mounting surface 11Mc intersecting the lateral surface 11*s* and extending on the side opposite to the light-emitting elements 20 with respect to the lateral surface 11*s*. The mounting surface 11Mc extends along the XZ-plane from the lateral surface 11*s*. In the direction perpendicular to the joint surface 11Mb, the mounting surface 11Mc is located below the joint surface 11Mb. In other words, the second surface is located below the first surface. There is a step between the first surface and the second surface. The step is defined by the lateral surface 11*s* and the mounting surface 11Mc. For example, a height h3 between the first surface and the second surface, or the height h3 between the joint surface 11Mb and the mounting surface 11Mc, is 100 μm or more and 500 μm or less in the direction perpendicular to the joint surface 11Mb.

The projecting portion of the first lateral wall portion 12-1 projecting from the joint surface 11Mb overlaps the mounting surface 11Mc in a top view. The height h3 from the mounting surface 11Mc to the joint surface 11Mb is smaller than a height h4 from the lower surface 11*b* of the substrate 11 to the mounting surface 11Mc. The height h4 is, for example, 200 μm or more and 1 mm or less, preferably, for example, 400 μm or more and 500 μm or less.

Light-Emitting Device 200

In the light-emitting device 200, the one or more lens members 70 are disposed on the mounting surface 11Mc of the substrate 11 and located outside the first cap 14. Similarly, the beam combiner 80 is disposed on the mounting surface 11Mc and located outside the first cap 14. On the optical path of light emitted from the light-emitting elements 20, the light-emitting elements 20, the optical member 40, the first lateral wall portion 12-1, the lens members 70, and the beam combiner 80 are disposed in this order in the direction (+Z direction) of the arrow of the Z-axis. The lens members 70 receive light emitted from the light-emitting elements 20 and transmitted through the first lateral wall portion 12-1. The beam combiner 80 is disposed on the mounting surface 11Mc and receives light emitted from the lens members 70.

Light emitted from the light exit surface 12*b* of the first lateral wall portion 12-1 is incident on the lens incident surfaces 71 of the lens members 70. A plurality of beams collimated by the lens members 70 then enter the beam combiner 80. The beams are combined on the same axis, and the multiplexed light is emitted from the beam combiner 80.

The lens members 70 each have the lens incident surface 71 facing the lateral surface 11*s* of the substrate 11. In the first direction (that is, the Z direction), a distance d3 between the lens incident surface 71 and the lateral surface 11*s* (or the virtual plane P) is smaller than the distance d1 between the lateral surface 11*s* (or the virtual plane P) and the light incident surface 12*a*. For example, the distance d3 is 100 μm or more and 500 μm or less in the first direction. It is advantageous to make the distance d3 smaller than the distance d1 in that the optical path length of the laser beam can be reduced. Making the distance d1 relatively large secures the area of joining between the joint surface 11Mb and the lower surface 12*c* and can therefore enhance the joining strength.

There is a gap G between the lens incident surface 71 of the lens member 70 and the light exit surface 12*b* of the first lateral wall portion 12-1. For example, a distance d4 between the lens incident surface 71 and the light exit surface 12*b* can be 1,000 μm or less in the first direction. The gap G secures the flexibility for aligning the lens members 70.

The lower surfaces 70*b* of the lens members 70 are joined to the mounting surface 11Mc with bonding members 90 interposed therebetween. The bonding members 90 can be formed of an adhesive such as UV-curable resins and thermosetting resins. For the UV-curable resins, adhesives of epoxy resins or acrylate resins can be used. For the thermosetting resins, adhesives of epoxy resins or silicone resins can be used. A portion of the bonding member 90 extends toward the lateral surface 11*s* beyond the light exit surface 12*b* in the first direction. For example, the width of the whole bonding member 90 in the Z direction in the example shown in FIG. 7 is about 200 μm to 2,000 μm. For example, the width of the portion of the bonding member 90 extending toward the lateral surface 11*s* beyond the light exit surface 12*b* in the Z direction can be about 50 to 100 μm. For example, the thickness of the bonding member 90 in the Y direction is 30 μm to 300 μm.

In the light-emitting device according to the second embodiment, the portion of the bonding member 90 protruding toward the lateral surface 11*s* beyond the lens incident surface 71 of the lens member 70 can escape into the space between the lateral surface 11*s* of the substrate 11 and the light exit surface 12*b* of the first lateral wall portion 12-1 in a top view. This structure can reduce interference between the bonding member 90 and the first lateral wall portion 12-1 of the first cap 14. The lens incident surface 71 of the lens member 70 and the light exit surface 12*b* of the first lateral wall portion 12-1 can thus be closer to each other to allow for such an arrangement as to reduce the distance d4. The optical path length from the emission of light from the light-emitting element 20 to the incidence on the lens incident surface 71 of the lens member 70 can therefore be reduced. In other words, reducing the distance from the emission of a beam having divergence from the light-emitting element 20 to the incidence on the lens incident surface 71 allows for reduction of the area of the lens incident surface 71 and is advantageous for miniaturization of the light-emitting device.

A portion under the first surface of the substrate 11 located inside the first cap 14 may be provided with via wiring, and a portion under the second surface located outside the first cap 14 may not be provided with via wiring.

Third Embodiment

A light-emitting device according to a third embodiment will be described referring to FIG. 9.

The light-emitting device according to the third embodiment differs from the light-emitting device 200 according to the second embodiment in that a surrounding body 15 is further included and further differs from the light-emitting device 200 according to the second embodiment in that the upper surface 70*a* of the lens member 70 is joined to a lower surface 15*b* of the surrounding body 15 with a bonding member interposed therebetween. The differences from the light-emitting device 200 according to the second embodiment will be mainly described below.

Figure 9:
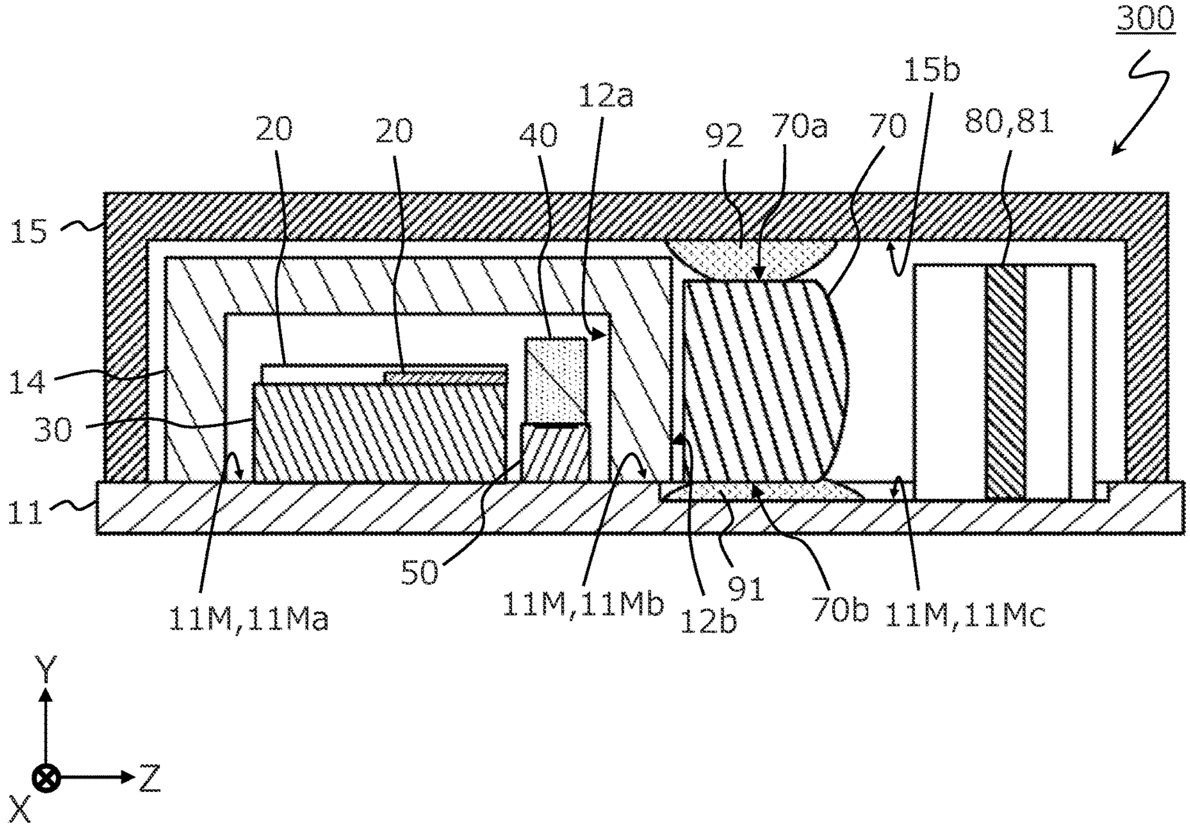
FIG. 9 is a schematic cross-sectional view of a light-emitting device according to a third embodiment in the present disclosure.

FIG. 9 is a schematic cross-sectional view of a light-emitting device 300. The cross section of the light-emitting device 300 shown in FIG. 9 corresponds to the cross section of the light-emitting device 200 shown in FIG. 7.

The light-emitting device 300 further includes the surrounding body 15. In the example shown in the drawing, the surrounding body 15 is a second cap 15. The light-emitting device 300 including the second cap 15 will be described below. The second cap 15 can be formed of the same material, such as glass, plastics, quartz, and sapphire, as the first cap 14. It is sufficient that the surrounding body 15 has a structure surrounding the inside, and for example, a member having the shape of a package covering the whole components may be employed.

As with the first cap 14, the second cap 15 in the example shown in the drawing substantially has the shape of a box. The second cap 15 is joined to the upper surface 11M of the substrate 11. The second cap 15 covers the upper and lateral sides of a plurality of light-emitting elements 20, one or plurality of lateral wall portions 12, and the lens member 70. In the example shown in the drawing, the upper and lateral sides of the beam combiner 80 and the first cap 14 are further covered.

Also in the light-emitting device 300, as with the light-emitting device 200 of the second embodiment, the lower surface 70*b* of the lens member 70 is joined to the mounting surface 11Mc of the substrate 11 with a first bonding member 91 interposed therebetween. Furthermore, in the light-emitting device 300, the upper surface 70*a* of the lens member 70 is joined to the lower surface 15*b* of the second cap 15 with a second bonding member 92 interposed therebetween. The second bonding member 92 extends toward the light incident surface 12*a* beyond the light exit surface 12*b* in the first direction. A portion of the second bonding member 92 is located in the gap between the first cap 14 and the second cap 15.

The first bonding member 91 and the second bonding member 92 may be formed of the same material or may be formed of different materials. Each of the first bonding member 91 and the second bonding member 92 can be formed of an adhesive such as UV-curable resins and thermosetting resins. Each of the first bonding member 91 and the second bonding member 92 may be formed of a UV-curable resin or a thermosetting resin. Alternatively, the first bonding member 91 can be formed of a UV-curable resin, and the second bonding member 92 can be formed of a thermosetting resin. Alternatively, the reverse may be true.

In the light-emitting device 300 according to the third embodiment, the lens member 70 is fixed at both the upper surface 70*a* and the lower surface 70*b* of the lens member 70. This structure can reduce the movement in the direction (Y direction) perpendicular to the lower surface 70*b* of the lens member 70 due to expansion or contraction of the first bonding member 91 and the second bonding member 92.

Fourth Embodiment

A light-emitting device according to a fourth embodiment will be described referring to FIG. 10A and FIG. 10B.

The light-emitting device according to the fourth embodiment differs from the light-emitting device 200 according to the second embodiment in that the first bonding member 91 and the second bonding member 92 are disposed on the light exit surface 12*b* of the first lateral wall portion 12-1. The differences from the light-emitting device 200 according to the second embodiment will be mainly described below.

Figure 10A:
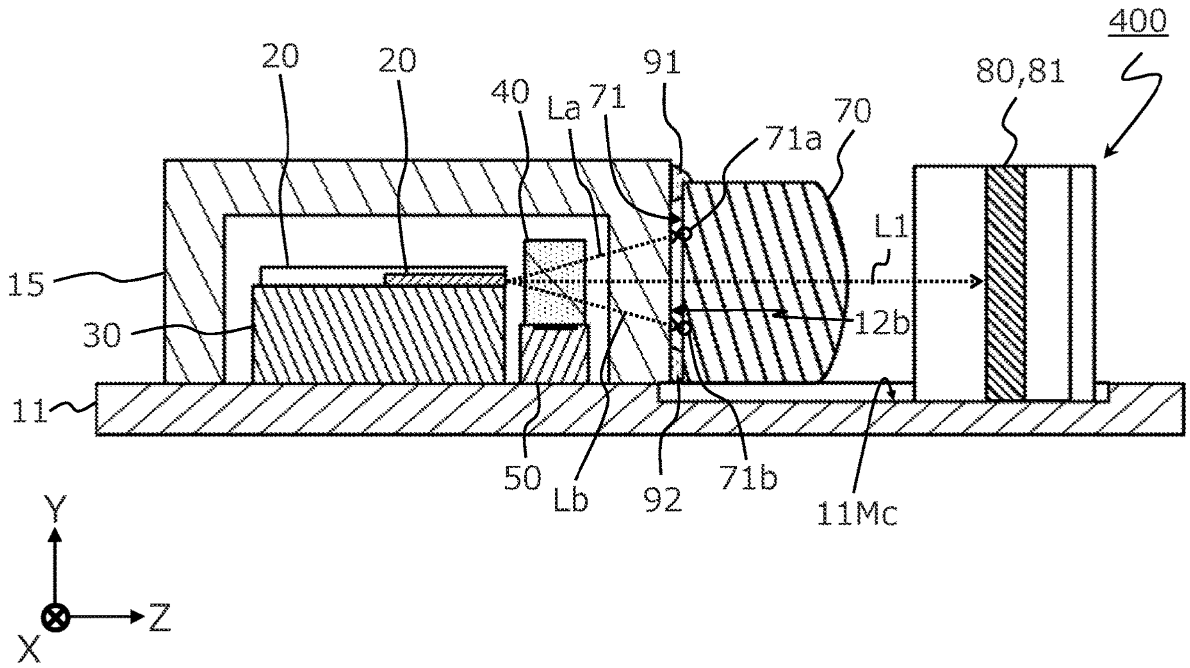
FIG. 10A is a schematic cross-sectional view of a light-emitting device according to a fourth embodiment in the present disclosure.
Figure 10B:
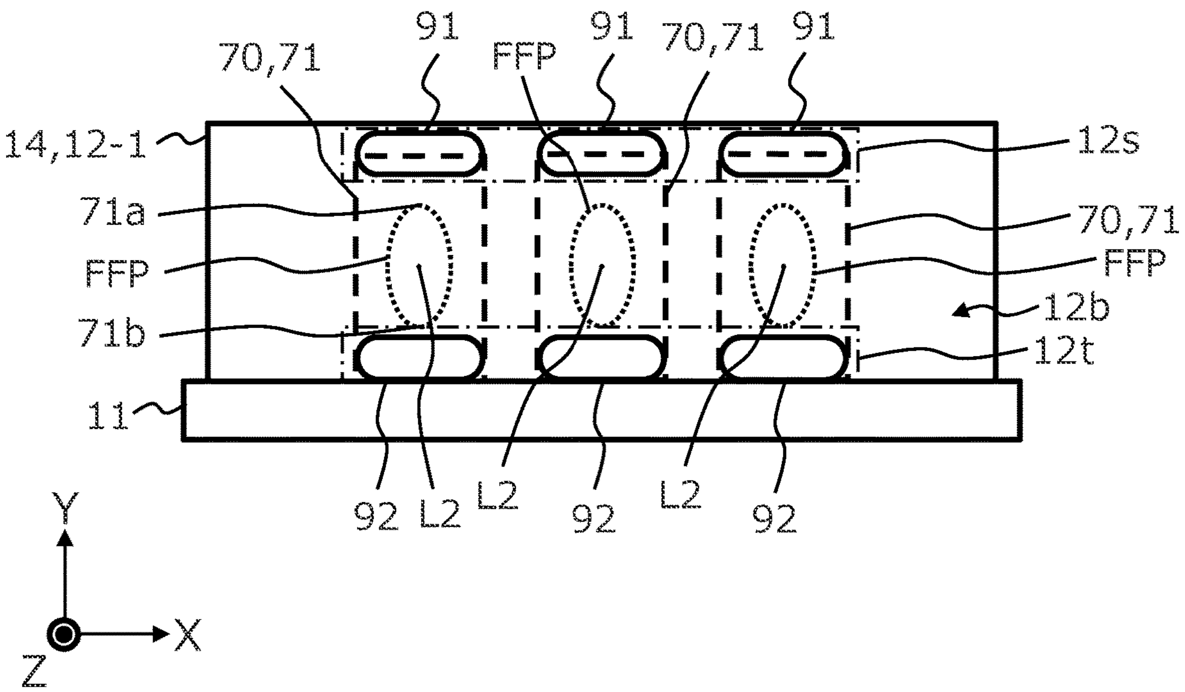
FIG. 10B schematically illustrates the positional relationship between first and second bonding members and an FFP of a laser beam on a lens incident surface of a lens member in the light-emitting device according to the fourth embodiment in the present disclosure.

FIG. 10A is a schematic cross-sectional view of a light-emitting device 400. The position of the cross section in the light-emitting device 400 shown in FIG. 10A corresponds to the position of the cross section in the light-emitting device 200 shown in FIG. 7 or the light-emitting device 300 shown in FIG. 9. FIG. 10B schematically illustrates the positional relationship between the first bonding member 91 or the second bonding member 92 and the FFP of a laser beam on the lens incident surface 71 of the lens member 70. In FIG. 10B, the lens incident surface 71 is indicated by a broken line, and the FFP of the laser beam incident on the lens incident surface 71 is indicated by a dotted line.

The outer shape of the FFP indicated by the dotted line represents the shape of the beam diameter of the main portion of light emitted from the light-emitting element 20. A lens optical axis L2 of the lens member 70 shown in FIG. 10B substantially coincides with an optical axis L1 of light emitted from the light-emitting element 20 and passes through the center of the FFP of the laser beam.

In the light-emitting device 400 in the example shown in the drawings, the lens incident surface 71 of the lens member 70 is joined to the light exit surface 12*b* of the first lateral wall portion 12-1 at a first joint 12*s* with the first bonding member 91 interposed therebetween and at a second joint 12*t* with the second bonding member 92 interposed therebetween. In the example shown in the drawings, the second bonding member 92 is not in contact with the mounting surface 11Mc.

The first joint 12*s* on the light exit surface 12*b* is located above the lens optical axis L2 of the lens member 70. More specifically, the first joint 12*s* is located above an incident position 71*a* of an upper end beam, at which a beam La passing through the upper end of the FFP of the laser beam is incident on the lens incident surface 71. The second joint 12*t* on the light exit surface 12*b* is located below the lens optical axis L2 of the lens member 70. More specifically, the second joint 12*t* is located below an incident position 71*b* of a lower end beam, at which a beam Lb passing through the lower end of the FFP of the laser beam is incident on the lens incident surface 71. Such an arrangement of the bonding members can prevent the first bonding member 91 and the second bonding member 92 from interfering with the main portion of the laser beam. The bonding members are not disposed on the lower surface 70*b* of the lens member 70, and the lower surface 70*b* of the lens member 70 is spaced apart from the mounting surface 11Mc. A bonding member may be disposed between the lower surface 70*b* (see FIG. 7) of the lens member 70 and the mounting surface 11Mc of the substrate 11 in addition to the first bonding member 91 and the second bonding member 92.

The same materials as the materials of a first bonding material and a second bonding material used in the light-emitting device 300 according to the third embodiment can be used for the materials of the first bonding member 91 and the second bonding member 92. Whether the first bonding member 91 and the second bonding member 92 are formed of the same material or different materials can also be selected as appropriate in the same manner as in the third embodiment.

In the light-emitting device 400, the lens incident surface 71 is joined to the light exit surface 12*b* with the first bonding member 91 and the second bonding member 92 interposed therebetween. Such joining can reduce misalignment of the optical axis of the lens member 70 due to expansion or contraction of the bonding members. Expansion or contraction of the first bonding member 91 and the second bonding member 92 mainly affects the movement in the direction (Z direction) perpendicular to the lens incident surface of the lens member 70 and hardly affects the movement in the direction (Y direction) orthogonal to the lower surface 70*b* of the lens member 70. The influence on the misalignment of the lens optical axis L2 of the lens member 70 can thus be reduced.

The embodiments according to the present invention have been described above, but the light-emitting device according to the present invention is not strictly limited to the light-emitting devices of the embodiments. That is, the present invention can be implemented without being limited to the outer shapes or structures of the light-emitting devices disclosed referring to the embodiments. For example, a light-emitting device including no protective element is possible. The present invention can be applied without requiring that all the components be included in a necessary and sufficient manner. For example, in the case where some of the components of the light-emitting device disclosed referring to the embodiments are not described in the claims, design flexibility such as substitution, omission, changes in shape, and changes in material of that part of the components by a person skilled in the art is accepted, and applications of the invention described in the claims are specified in consideration of that acceptance.

The light-emitting device in the embodiments can be used for a head-mounted display, a projector, lighting, a display, or the like.

What is claimed is:

1. A light-emitting device comprising:

a light-emitting element;

a substrate supporting the light-emitting element; and one or more lateral wall portions joined to the substrate to surround the light-emitting element, the one or more lateral wall portions including a first lateral wall portion having a light incident surface configured to receive a light emitted from the light-emitting element and traveling in a first direction and a light exit surface configured to emit the light transmitted through the light incident surface, the light incident surface being disposed between the light-emitting element and the light exit surface, wherein the substrate has a joint surface joined to the first lateral wall portion and a lateral surface meeting the joint surface, the lateral surface being located between the light incident surface and the light exit surface in a top view as viewed in a direction perpendicular to the joint surface.

2. The light-emitting device according to claim 1, wherein the first lateral wall portion has a lower surface joined to the joint surface, and the light incident surface meets the lower surface.

3. The light-emitting device according to claim 1, wherein an optical axis of the light intersects a virtual plane extending parallel to the lateral surface of the substrate and including the lateral surface of the substrate, and an intersection point between the optical axis of the light and the virtual plane is located between the light incident surface of the first lateral wall portion and the light exit surface of the first lateral wall portion in the top view.

4. The light-emitting device according to claim 1, wherein a distance between the lateral surface of the substrate and the light incident surface of the first lateral wall portion in the first direction is longer than a distance between the lateral surface of the substrate and the light exit surface of the first lateral wall portion in the first direction.

5. The light-emitting device according to claim 1, further comprising a top portion connected to the one or more lateral wall portions, wherein the light-emitting element is disposed inside a sealed space formed by the substrate, the one or more lateral wall portions, and the top portion, and a height of an intersection point between an optical axis of the light and the light incident surface of the first lateral wall portion from the joint surface of the substrate is higher than half of a height of a lower surface of the top portion from the joint surface of the substrate in a direction perpendicular to the joint surface of the substrate.

6. The light-emitting device according to claim 5, further comprising a light-receiving element disposed inside the sealed space, wherein the light-receiving element has a light receiving surface configured to receive a portion of the light, and the light receiving surface is located below the intersection point in the direction perpendicular to the joint surface of the substrate.

7. The light-emitting device according to claim 1, wherein the substrate further has a mounting surface meeting the lateral surface and extending on a side opposite the light-emitting element with respect to the lateral surface, and the mounting surface is located below the joint surface in the direction perpendicular to the joint surface.

8. The light-emitting device according to claim 7, wherein a distance between the joint surface of the substrate and the mounting surface of the substrate is 100 μm or more and 500 μm or less in the direction perpendicular to the joint surface of the substrate.

9. The light-emitting device according to claim 7, further comprising a lens member disposed on the mounting surface of the substrate and having a lens incident surface configured to receive the light, the lens incident surface facing the lateral surface of the substrate, wherein a distance between the lens incident surface of the lens member and the lateral surface of the substrate in the first direction is smaller than a distance between the lateral surface of the substrate and the light incident surface of the first lateral wall portion in the first direction.

10. The light-emitting device according to claim 9, wherein the lens incident surface of the lens member is spaced apart from the light exit surface of the first lateral wall portion with a gap being formed therebetween.

11. The light-emitting device according to claim 9, wherein a distance between the lens incident surface of the lens member and the light exit surface of the first lateral wall portion is 1,000 μm or less in the first direction.

12. The light-emitting device according to claim 9, wherein the lens member is joined to the mounting surface of the substrate with a first bonding member being interposed between the lens member and the mounting surface of the substrate, and a portion of the first bonding member extends toward the lateral surface of the substrate beyond the light exit surface of the first lateral wall portion in the first direction.

13. The light-emitting device according to claim 12, further comprising a surrounding body joined to the substrate and disposed to cover upper and lateral sides of the light-emitting element, the one or more lateral wall portions, and the lens member, wherein the lens member has an upper surface and a lower surface, the upper surface of the lens member is joined to a lower surface of the surrounding body with a second bonding member being interposed between the upper surface of the lens member and the lower surface of the surrounding body, and the second bonding member extends toward the light incident surface of the first lateral wall portion beyond the light exit surface of the first lateral wall portion in the first direction.

14. The light-emitting device according to claim 9, wherein the lens incident surface of the lens member and the light exit surface of the first lateral wall portion are joined together at a first joint located above an optical axis of the lens member with a first bonding member being interposed between the lens incident surface of the lens member and the light exit surface of the first lateral wall portion and at a second joint located below the optical axis of the lens member with a second bonding member interposed between the lens incident surface of the lens member and the light exit surface of the first lateral wall portion.

15. The light-emitting device according to claim 14, wherein the second bonding member is not in contact with the mounting surface of the substrate.

* * * * *